US008755245B1

(12) United States Patent
Reynolds

(10) Patent No.: US 8,755,245 B1
(45) Date of Patent: Jun. 17, 2014

(54) DECODER CONTROL

(75) Inventor: David Reynolds, Scarborough, ME (US)

(73) Assignee: Analog Devices, Inc., Norwood, MA (US)

( * ) Notice: Subject to any disclaimer, the term of this patent is extended or adjusted under 35 U.S.C. 154(b) by 237 days.

(21) Appl. No.: 13/364,457

(22) Filed: Feb. 2, 2012

Related U.S. Application Data

(60) Provisional application No. 61/439,016, filed on Feb. 3, 2011.

(51) Int. Cl.
*G11C 8/00* (2006.01)

(52) U.S. Cl.
USPC .................................. 365/230.06; 365/230.08

(58) Field of Classification Search
USPC ............................ 365/230.06, 230.08, 230.01
See application file for complete search history.

(56) References Cited

U.S. PATENT DOCUMENTS

| 6,563,579 B1 * | 5/2003 | Kimura et al. ................ 356/246 |
| 2010/0103746 A1 * | 4/2010 | Ma .......................... 365/189.05 |

* cited by examiner

*Primary Examiner* — Vu Le
(74) *Attorney, Agent, or Firm* — Occhiuti & Rohlicek LLP

(57) ABSTRACT

A decoder control makes use of controllable transfer gates, which effectively implement selectors, to implement required timing offsets for codes that have particular structure. For instance, such timing offsets are effective for LDPC codes with block off-diagonal structure, for instance, as described in the co-pending application. In some implementations, the memory architecture is formed of cells where each cell includes not only a storage element, by also control logic that combines a select signal and the write versus read signal. By co-locating this control logic in each memory cell, control logic and its associated signal distribution is reduced, thereby reducing circuit area and power consumption.

13 Claims, 6 Drawing Sheets

DECODER CONTROL

STATEMENT AS TO FEDERALLY SPONSORED RESEARCH

This invention was made with government support under FA8750-07-C-0231 awarded by the Defense Advanced Research Projects Agency (DARPA). The government has certain rights in the invention.

CROSS-REFERENCE TO RELATED APPLICATIONS

This application claims the benefit of U.S. Provisional Application No. 61/439,016, filed Feb. 3, 2011.

This application is related to PCT Application PCT/US10/25956, titled "Belief Propagation Processor," published on Sep. 10, 2010, as WO/2010/101944. This related application claims the benefit of U.S. Provisional Application No. 61/156,792, titled "Belief Propagation Processor," filed Mar. 2, 2009, and U.S. Provisional Application No. 61/293,999, filed Jan. 11, 2010. This application is also related to PCT Application PCT/US11/20794, titled "Belief Propagation Processor," filed on Jan. 11, 2011. Each of the above referenced applications is incorporated herein by reference.

BACKGROUND

This invention relates to control of a decoder, and in particular, control of an analog decoder that implements a belief propagation approach.

SUMMARY

Copending PCT Applications PCT/US10/25956, titled "Belief Propagation Processor," and PCT/US11/20794, titled "Belief Propagation Processor," disclose a detailed architectures, which may be used for implementing an LDPC decoder using an analog belief propagation approach. In some implementations, the sequencing of the iterations and memory structure described in the copending applications are adapted as described in the present application to reduce the combinational control logic required, thereby reducing the total area and power consumption of the decoder.

In some aspects, the decoder control makes use of controllable transfer gates, which effectively implement selectors, to implement required timing offsets for codes that have particular structure. For instance, such timing offsets are effective for LDPC codes with block off-diagonal structure, for instance, as described in the co-pending application.

In some aspects, the memory architecture is formed of cells where each cell includes not only a storage element, by also control logic that combines a select signal and the write versus read signal. By co-locating this control logic in each memory cell, control logic and its associated signal distribution is reduced, thereby reducing circuit area and power consumption.

In another aspect, in general, memory control circuitry is used for sequencing memory operations for a memory comprising a plurality of sections in an iterative process. Each iteration includes a plurality of phases, and each phase comprises a plurality of cycles. The memory control circuitry includes a sequence generator configured to output a plurality of phase control signals, each phase control signal being associated with a different phase of an iteration, and configured to output a plurality of cycle control signals, each associated with a different cycle of a phase. A plurality of control signal selectors is incorporated in the memory control circuitry. Each control signal selector is associated with a different section of the plurality of sections of the memory. Each control signal selector is configured to accept the phase control signals and the cycle control signals and to output a plurality of column control signals. The selector includes, for each output, a selector circuit responsive to the phase control signals to select one of the cycle control signals accepted by the selector. The memory control circuitry is configured to apply to each memory section the phase control signals and the column control signals output from the control signal selector associated with the memory section to select memory cells in the memory section. At least some of the memory cells are selected in a read mode and at least some cells are selected in a write mode responsive to the phase and column control signals.

Aspects can include one or more of the following features.

The memory control circuitry further comprises the memory. Each memory cell in the memory cell includes logic circuitry for accepting one of the column control signals and one of the phase control signals determining whether to select the memory cell in either a read mode or a write mode.

Each memory cell further comprises an analog value storage element.

The memory cells are arranged in a rectangular grid, and each column control signal is applied to memory cells along one axis of the grid, and each phase control signal is applied to memory cells along the other axis of the grid.

The selector circuit for each output of the control signal selector comprises a plurality of transfer gates, each coupled for coupled for control by one of the phase control signals to transfer a selected cycle control signal to the output.

Each control signal selector is configured to transfer during each cycle each cycle control signal to multiple outputs of said selector.

In another aspect, in general, a method is applied to controlling memory access in an analog parity check code decoder that include a memory comprising a plurality of sections. The method includes sequencing memory operations for the memory in an iterative process, each iteration comprising a plurality of phases, and each phase comprising a plurality of cycles. Each cycle includes generating in a sequence generator a plurality of phase control signals, each phase control signal being associated with a different phase of an iteration, and a plurality of cycle control signals, each associated with a different cycle of a phase. Each control signal selector of a plurality of control signal selectors is configured according to the phase control signals. Each control signal selector is associated with a different section of the plurality of sections of the memory. The cycle control signals are applied to each control signal selector of a plurality of control signal selectors and the cycle control signals are transferred to column control signals output from control signal selector configured according to the phase control signals. For each output one of the cycle control signals is selected as an output column control signal. The phase control signals and the column control signals output from the control signal selector associated with each memory section are applied to the memory section to select memory cells in the memory section. At least some of the memory cells are selected in a read mode and at least some cells are selected in a write mode responsive to the phase and column control signals.

Aspects may include one or more of the following features.

The parity check code is associated with a code matrix having a block structure, with each non-zero block having an off-diagonal structure, and each block row is associated with one of the phases, each block column is associated with one of the memory sections, and each row is associated with a cycle.

Sequencing the memory operations further includes, at each cycle, combining outputs of one or more groups of outputs of memory cells selected in a read mode, applying the combined outputs of each group to an input of a corresponding analog computation module, and passing an output of the corresponding analog computation module to a memory cell selected in a write mode.

Combining the outputs of the memory cells includes applying current outputs of the memory cells to a current summing bus coupled to the input of the analog computation module.

In another aspect, in general, a memory arrangement includes a rectangular arrangement of memory cells. Signal paths are configured for distributing a plurality of select signals, each signal path distributing one of the select signals along cells along a first of the dimensions of the rectangular arrangement. Signal paths are also configured for distributing a plurality of mode signals, each signal path distributing one of the mode signals along cells along a second of the dimensions of the rectangular arrangement. Each memory cell includes logic circuitry for accepting one or the select signals and one or the mode signals to determine whether to select the memory cell in either a read mode or a write mode. In some examples, a read data path and a write data path in included for each group of memory cells along the first of the dimensions. In some examples, the read data path for each group is configured to combine outputs of multiple memory cells selected in a read mode.

Other features and advantages of the invention are apparent from the following description, and from the claims.

DESCRIPTION

Figure 1:
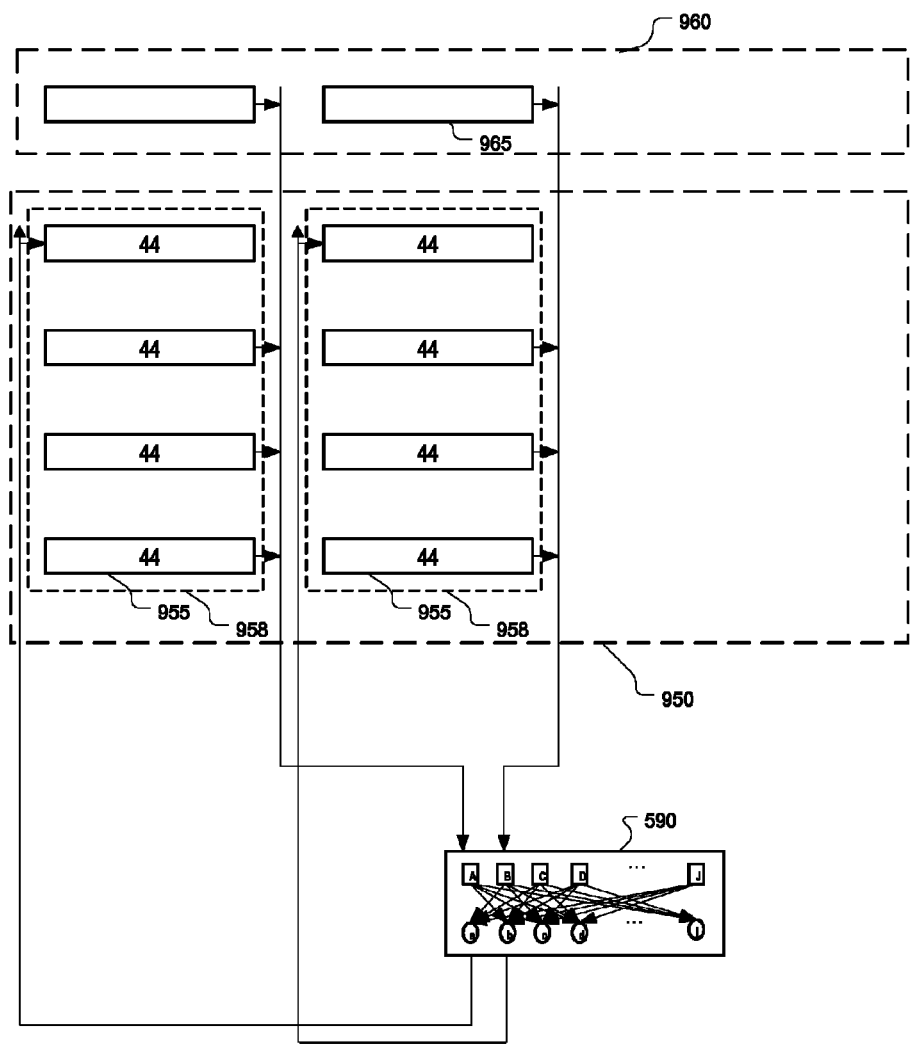
FIG. 1 is a diagram logical block diagram of a portion of a decoder.

Referring to FIG. 1, which corresponds to FIG. 19 of the incorporated "Belief Propagation Processor" application, shows a set of storage arrays 955, each associated with a non-zero block of the code matrix.

The reader is referred to the incorporated application for details regarding the operation of the decoder as illustrated. Generally, the decoder operates in four phases, each phase associated with one even and one odd block row of the decoding. For example, phase $\phi_0$ is associated with block rows 0 and 1. Each block column of the code matrix is associated with one of the columns of memory arrays as shown in FIG. 1. Note that in each of the four successive phases, one of the memory block 955 for a block column is written, while the remaining blocks 955 and the input block 965 are read.

Figure 2:
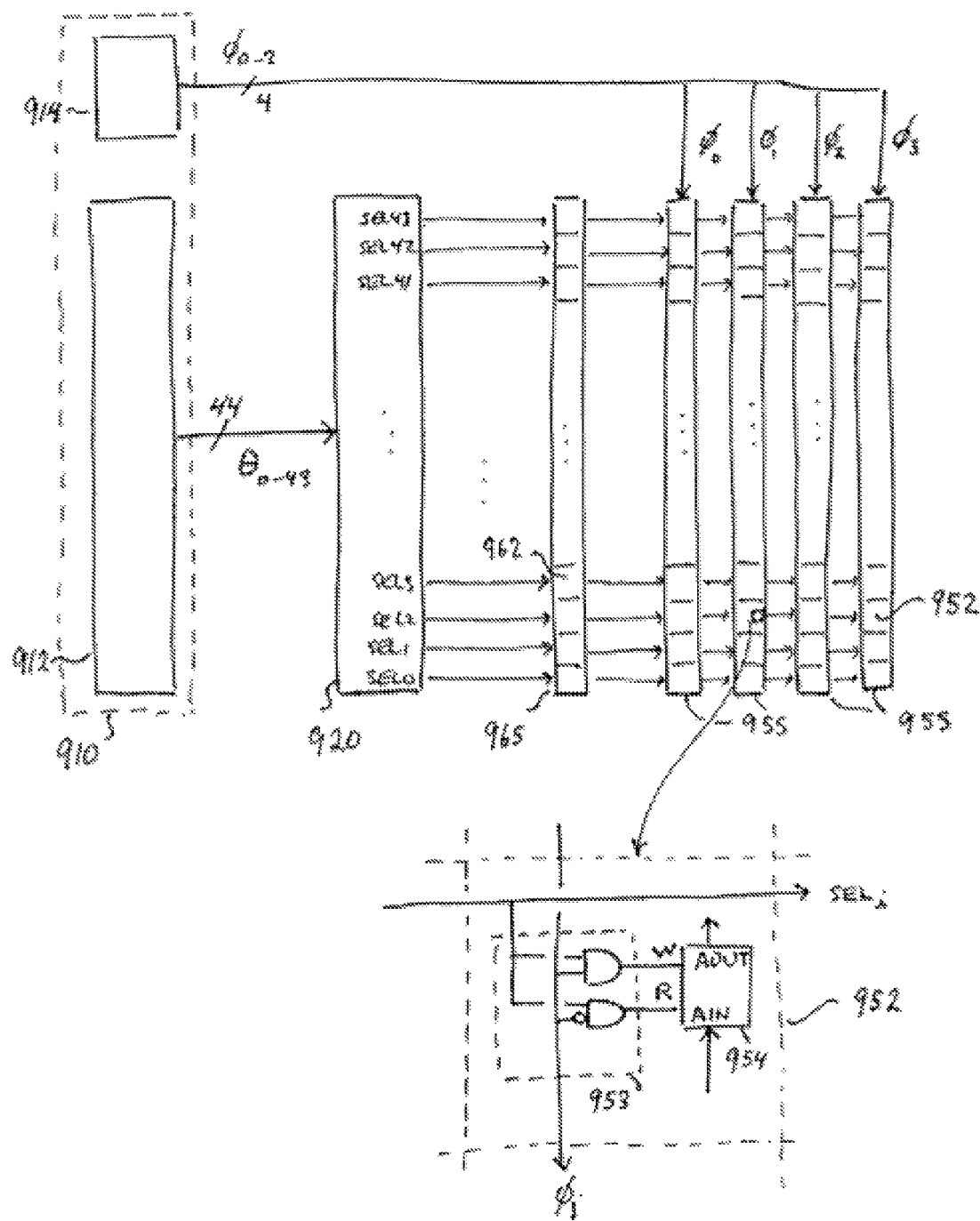
FIG. 2 is a diagram for control logic associated with the block diagram of FIG. 1.

Referring to FIG. 2, the memory arrays 955 and input array 965 for one column are illustrated (the orientation of which is rotated 90 degrees relative to FIG. 1). During one phase of the decoding operation, all 44 rows (i.e., constraints) within a block row are evaluated. The sequencing of the four phases is generated by a phase control module 914, which generates four phase signals $\phi_{0-3}$. During each of the four phases, a cycle control module 910 generates 44 cycle control signals $\theta_{0-43}$.

Because of the offset diagonal structure of the code matrix, in order to cycle through the rows of the block, the sequence of columns being read or written is offset (mod 44). This offset, which depends on the phase, whether the memory is for the even or odd block row, and the block column, is applied in a transfer gate selector 920. Operation of the selector 920 is described more fully below. Generally, the selector inputs 44 cycle control signals $\theta_{0-43}$ and outputs 44 column select signals $SEL_{0-43}$.

Each memory array 955 includes 44 memory cells 952. Each memory cell 952 includes an analog storage cell 954 as well as control logic 953. The control logic determines, on cycles in which the cell is selected, whether the cell is in a write mode or a read mode, depending on the phase control (i.e., mode) signal $\phi_i$. Note that although the memory arrays 955 are drawn separately, in some implementations, these arrays are combined into a larger array.

Figure 3:
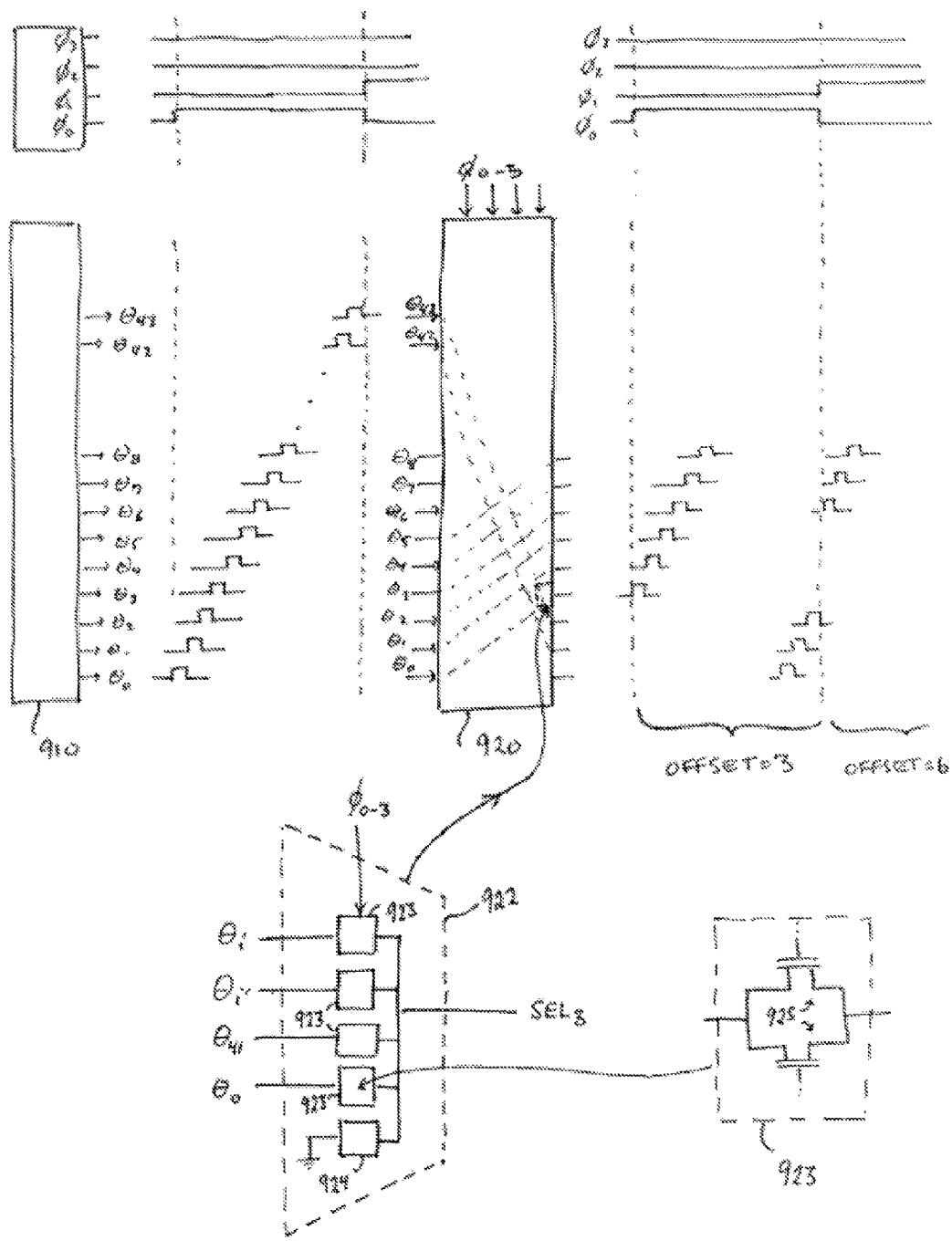
FIG. 3 is a detailed block diagram of a portion of FIG. 2.

Referring to FIG. 3, operation of the cycle control module 910 and selector 920 can be understood as follows. Regardless of the phase of the decoding a single cycle control module 920 sends cycle control signals $\theta_{0-43}$ to each of the selectors 920 (i.e., one for each block column of the code matrix). The cycle control signals are such that $\theta_i$ is high on the $i^{th}$ cycle in the phase and low otherwise. The selector is such that depending on an offset appropriate for the phase, $SEL_j$ is high on the $i^{th}$ cycle for j=i+OFFSET mod 44.

The selector 920 includes 44 control signal selectors 922, which select one of four possible cycle control signal using a selector 923 according to the phase of decoding. For example, in the illustration, at phase $\phi_0$ the offset is 3, and therefore $SEL_3$ is driven by $\theta_0$ in that phase. At phase $\phi_1$, the illustrated offset is 6, and therefore $SEL_3$ is driven by $\theta_{41}$ (i.e., 3=41+6 mod 44). At any time that no phase control input is active, the selector 922 selects a default ground signal.

In at least some implementations, each selector 923 is implemented using a transfer gate circuit, which uses a pair of complementary transistors 925 to pass the input cycle control signal according to the phase input.

Figure 4:
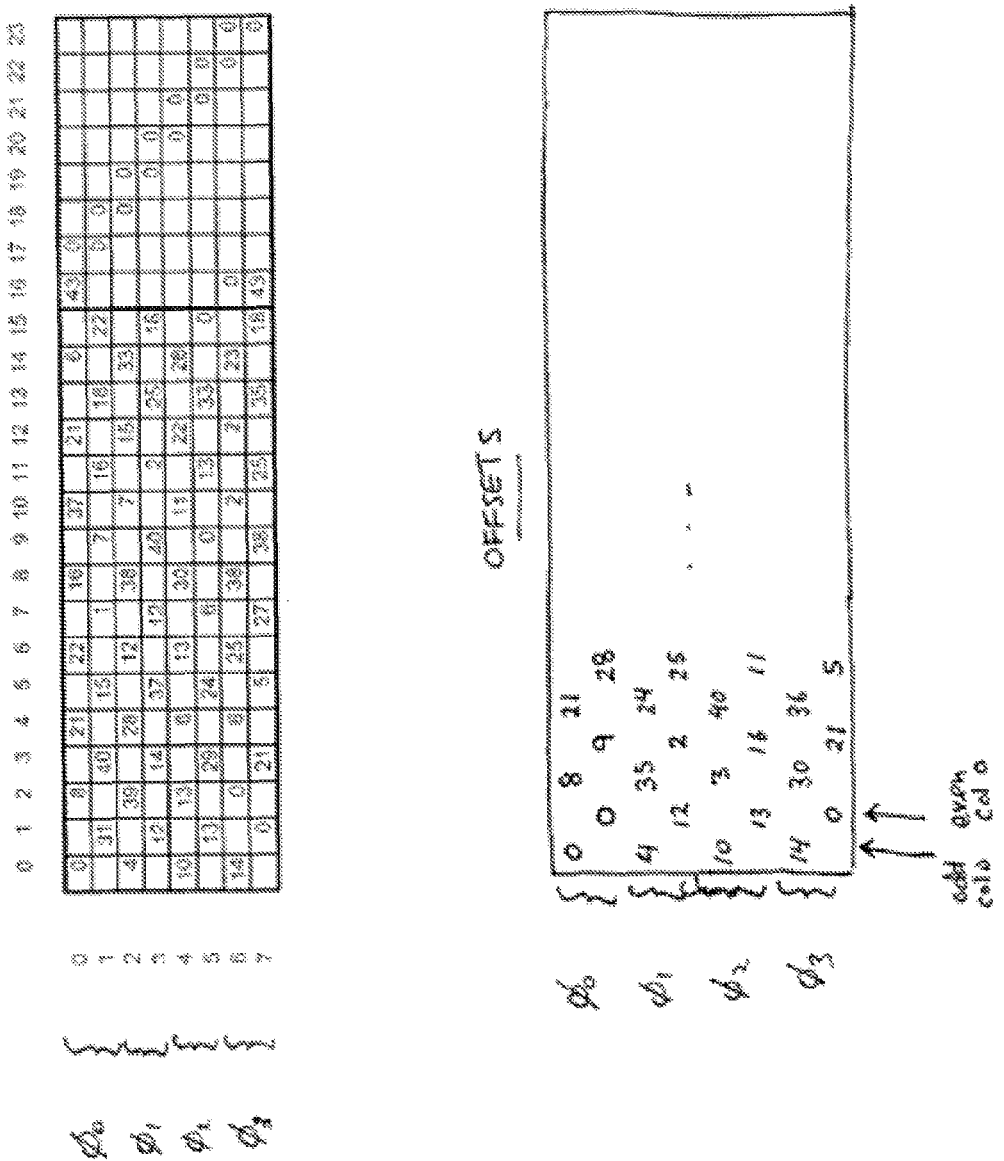
FIG. 4 is a diagram illustrating determination of phase offsets.

Referring to FIG. 4, the required offsets for each block column can be determined according to the offsets of the off-block diagonals of the code matrix. For example, for the code matrix illustrated at the top of FIG. 4, suitable OFFSET values for the columns at the different phases are shown.

Figure 5:
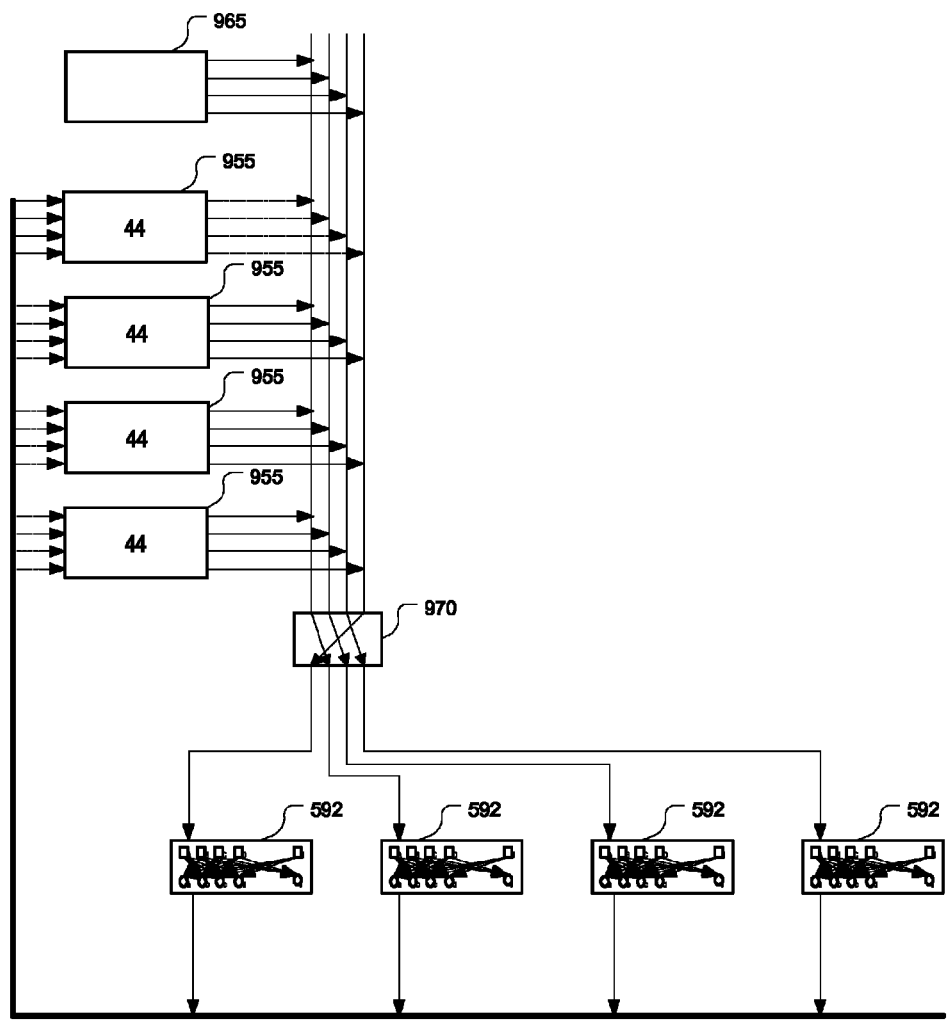
FIG. 5 is a diagram logical block diagram of a portion of a decoder with 4-way parallel operation.
Figure 6:
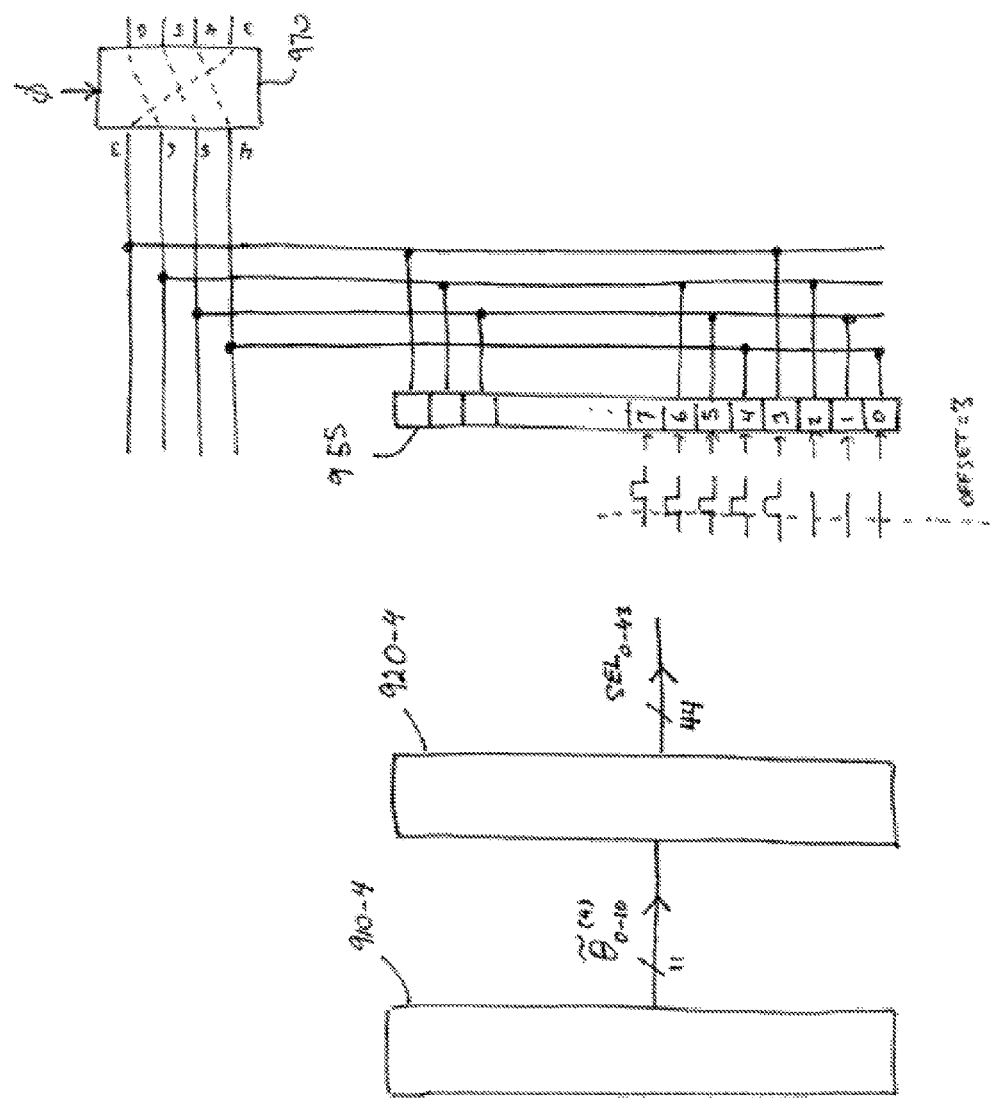
FIG. 6 is a diagram for control logic associated with the block diagram of FIG. 5.

Referring to FIG. 5, which corresponds to FIG. 20 in the incorporated application, in some implementations, multiple (e.g., four) rows are evaluated in parallel. Details of this parallelism may be found in the incorporated application. Referring to FIG. 6, in such a four-way parallel implementation, a cycle control module 910-4 generates eleven cycle control signals $\tilde{\theta}_{0-10}$. The selector 920-4 is similar to selector 920 of FIG. 3, with internal definition of cycle control signals $\theta_j = \tilde{\theta}_{j div 4}$. For example, with an OFFSET=3, during the cycle that $\theta_0$ is high, each of $SEL_{3-6}$ are high. Each memory cell is coupled to one of four memory busses (which add their current represented outputs) as described in the incorporated application. These busses pass through a rotator 970, which rotates these output currents according to the offset of the phase, or more precisely, according to the offset mod 4. For example, with an offset of 3, the rotator takes the inputs for columns 4, 5, 6, 3 and outputs them in order 3, 4, 5, 6 for suitable combination in the computation blocks 592 (see FIG. 5).

It is to be understood that the foregoing description is intended to illustrate and not to limit the scope of the invention, which is defined by the scope of the appended claims. Other embodiments are within the scope of the following claims.

What is claimed is:

1. Memory control circuitry for sequencing memory operations for a memory comprising a plurality of sections in an iterative process, each iteration comprising a plurality of phases, and each phase comprising a plurality of cycles, the memory control circuitry comprising:
   a sequence generator configured to output a plurality of phase control signals, each phase control signal being associated with a different phase of an iteration, and configured to output a plurality of cycle control signals, each associated with a different cycle of a phase; and
   a plurality of control signal selectors, each control signal selector being associated with a different section of the plurality of sections of the memory, each control signal selector being configured to accept the phase control signals and the cycle control signals and to output a plurality of column control signals, the selector including for each output a selector circuit responsive to the phase control signals to select one of the cycle control signals accepted by the selector;
   wherein the memory control circuitry is configured to apply to each memory section the phase control signals and the column control signals output from the control signal selector associated with the memory section to select memory cells in the memory section, including selecting at least some of the memory cells in a read mode and at least some cells in a write mode responsive to the phase and column control signals.

2. The memory control circuitry of claim 1 further comprising the memory, each memory cell in the memory cell including logic circuitry for accepting one of the column control signals and one of the phase control signals determining whether to select the memory cell in either a read mode or a write mode.

3. The memory control circuitry of claim 2 wherein each memory cell further comprises an analog value storage element.

4. The memory control circuit of claim 2 wherein the memory cells are arranged in a rectangular grid, and wherein each column control signal is applied to memory cells along one axis of the grid, and wherein each phase control signal is applied to memory cells along the other axis of the grid.

5. The memory control circuitry of claim 1 wherein the selector circuit for each output of the control signal selector comprises a plurality of transfer gates, each coupled for control by one of the phase control signals to transfer a selected cycle control signal to the output.

6. The memory control circuitry of claim 1 wherein each control signal selector is configured to transfer during each cycle each cycle control signal to multiple outputs of said selector.

7. A method for controlling memory access in an analog parity check code decoder, the decode comprising a memory comprising a plurality of sections, the method comprising:
   sequencing memory operations for the memory in an iterative process, each iteration comprising a plurality of phases, and each phase comprising a plurality of cycles including
   generating in a sequence generator a plurality of phase control signals, each phase control signal being associated with a different phase of an iteration, and a plurality of cycle control signals, each associated with a different cycle of a phase, and
   configuring each control signal selector of a plurality of control signal selectors according to the phase control signals, each control signal selector being associated with a different section of the plurality of sections of the memory;
   applying the cycle control signals to each control signal selector of a plurality of control signal selectors and transferring the cycle control signals to column control signals output from control signal selector configured according to the phase control signals, including for each output selecting one of the cycle control signals as an output column control signal;
   applying to each memory section the phase control signals and the column control signals output from the control signal selector associated with the memory section to select memory cells in the memory section, including selecting at least some of the memory cells in a read mode and at least some cells in a write mode responsive to the phase and column control signals.

8. The method of claim 7 wherein the parity check code is associated with a code matrix is block structure, with each non-zero block having an off-diagonal structure, and wherein each block row is associated with one of the phases, each block column is associated with one of the memory sections, and each row is associated with a cycle.

9. The method of claim 7 wherein sequencing the memory operations further includes, at each cycle, combining outputs of one or more groups of outputs of memory cells selected in a read mode, applying the combined outputs of each group to an input of a corresponding analog computation module, and passing an output of the corresponding analog computation module to a memory cell selected in a write mode.

10. The method of claim 9 wherein combining the outputs of the memory cells includes applying current outputs of the memory cells to a current summing bus coupled to the input of the analog computation module.

11. A memory arrangement comprising:
   a rectangular arrangement of memory cells;
   signal paths distributing a plurality of select signals, each signal path distributing one of the select signals along cells along a first of the dimensions of the rectangular arrangement; and
   signal paths distributing a plurality of mode signals, each signal path distributing one of the mode signals along cells along a second of the dimensions of the rectangular arrangement;
   wherein each memory cell includes logic circuitry for accepting one or the select signals and one or the mode signals to determine whether to select the memory cell in either a read mode or a write mode.

12. The memory arrangement of claim 11 further comprising:
   a read data path and a write data path for each group of memory cells along the first of the dimensions.

13. The memory arrangement of claim 12 wherein the read data path for each group is configured to combine outputs of multiple memory cells selected in a read mode.

* * * * *